United States Patent [19]

Vosteen

[11] 3,851,270

[45] Nov. 26, 1974

[54] TRANSISTORIZED OPERATIONAL AMPLIFIER

[76] Inventor: Robert E. Vosteen, 315 W. Center St., Medina, N.Y. 14103

[22] Filed: Apr. 20, 1971

[21] Appl. No.: 135,752

Related U.S. Application Data

[63] Continuation of Ser. No. 710,986, March 6, 1968, abandoned.

[52] U.S. Cl. .................... 330/30 D, 330/35, 330/24

[51] Int. Cl. .............................................. H03f 3/68

[58] Field of Search ......................... 330/30 D, 69, 9

[56] References Cited

UNITED STATES PATENTS 3,370,242 2/1968 Offner ............................. 330/69 X 3,474,347 10/1969 Praglin et al. ................ 330/30 D X

*Primary Examiner*—Nathan Kaufman

*Attorney, Agent, or Firm*—Albert J. Santorelli

[57] ABSTRACT

An operational amplifier comprising transistors in which the input stage has a constant current load. A feedback regulator circuit is employed to stabilize operation of the input stage. The operational amplifier provides a high impedance, high gain input stage, thereby minimizing gain requirements of succeeding stages. The matching of components comprising succeeding stages is therefore not overly critical.

12 Claims, 3 Drawing Figures

INVENTOR
ROBERT E. VOSTEEN

BY Irons, Birch, Swindler & McKie

ATTORNEYS

INVENTOR

ROBERT E. VOSTEEN

BY Jones, Birch, Swindler & McKie

ATTORNEYS

TRANSISTORIZED OPERATIONAL AMPLIFIER

This is a continuation of Ser. No. 710,986, 3/6/68, now abandoned.

BACKGROUND OF THE INVENTION:

1. Field of the Invention:

The application relates to a DC operational transistor amplifier having particularly desirable characteristics. Operational amplifiers may be employed for a wide variety of purposes, such as those in which high gain amplification is required, as for example a transducer amplifier, to those in which unity gain is required, as for example, a voltage follower.

2. Description of the Prior Art:

The prior art discloses operational amplifiers having limited gain for a given bandwidth of useful response. Applicant's patent entitled "Transistor Operational Amplifier," U.S. Pat. No. 3,077,566, concerns an improved operational amplifier having an open loop voltage gain of at least 10,000, a short circuit gain of at least 100,000, full amplitude to at least 10 kcs. and unity bandwidth to at least 500 kcs. at reduced amplitude.

It has been known that field effect transistors (FET's) may be used in place of bipolar transistors in the input stage of operational amplifiers to provide a very high input impedance, but FET's normally have a much lower transconductance compared to bipolar transistors, and if used, decrease the open loop voltage gain by an order of magnitude. This normally reduces the gain of the operational amplifier to a value that is excessively low, and therefore limits the use of the amplifier.

Additionally, the use of FET transistors in the input stage of an operational amplifier normally would necessitate that following stages be matched with exceptional care in order to prevent excessive drift in stability due to the temperature coefficients of components to maximize overall amplifier gain. The prior art, while recognizing the desirability of obtaining high operational amplifier input impedance, does not teach the successful utilization of FET's to obtain this characteristic without the introduction of undesirable characteristics.

SUMMARY OF THE INVENTION:

These and other defects of the prior art operational amplifiers are solved by the present invention wherein the input stage of the operational amplifier has a very high input impedance. The load circuit of the input stage comprises a constant current load that maximizes the gain of the amplifier. A feedback regulator circuit is employed to stabilize operation of the input stage.

The input stage comprises a pair of transistor amplifiers connected in differential amplifier fashion consisting of either FET or bipolar transistors. Transistors are connected in the load circuits of the pair of transistors comprising the input stage to provide a constant current load. The gain of the input stage is maximized, and succeeding stages are provided to further increase the overall amplifier gain. Because the input stage provides high gain, the gain and also the stability requirements of the succeeding stages is not as critical compared to prior art devices. The necessity that components comprising sudceeding stages be precisely matched is thus not overly critical.

A common mode feedback regulator is connected to the input stage of the amplifier to stabilize the outputs of the pair of transistors comprising the input stage at a constant average value. An operational amplifier having high input impedance, high gain and a wide bandwidth of useful response relative to prior art devices is thereby obtained.

Additionally, the operational amplifier may be connected to comprise a true differential operational amplifier, having very high input impedance and improved operating characteristics compared to prior art devices.

Figure 1:
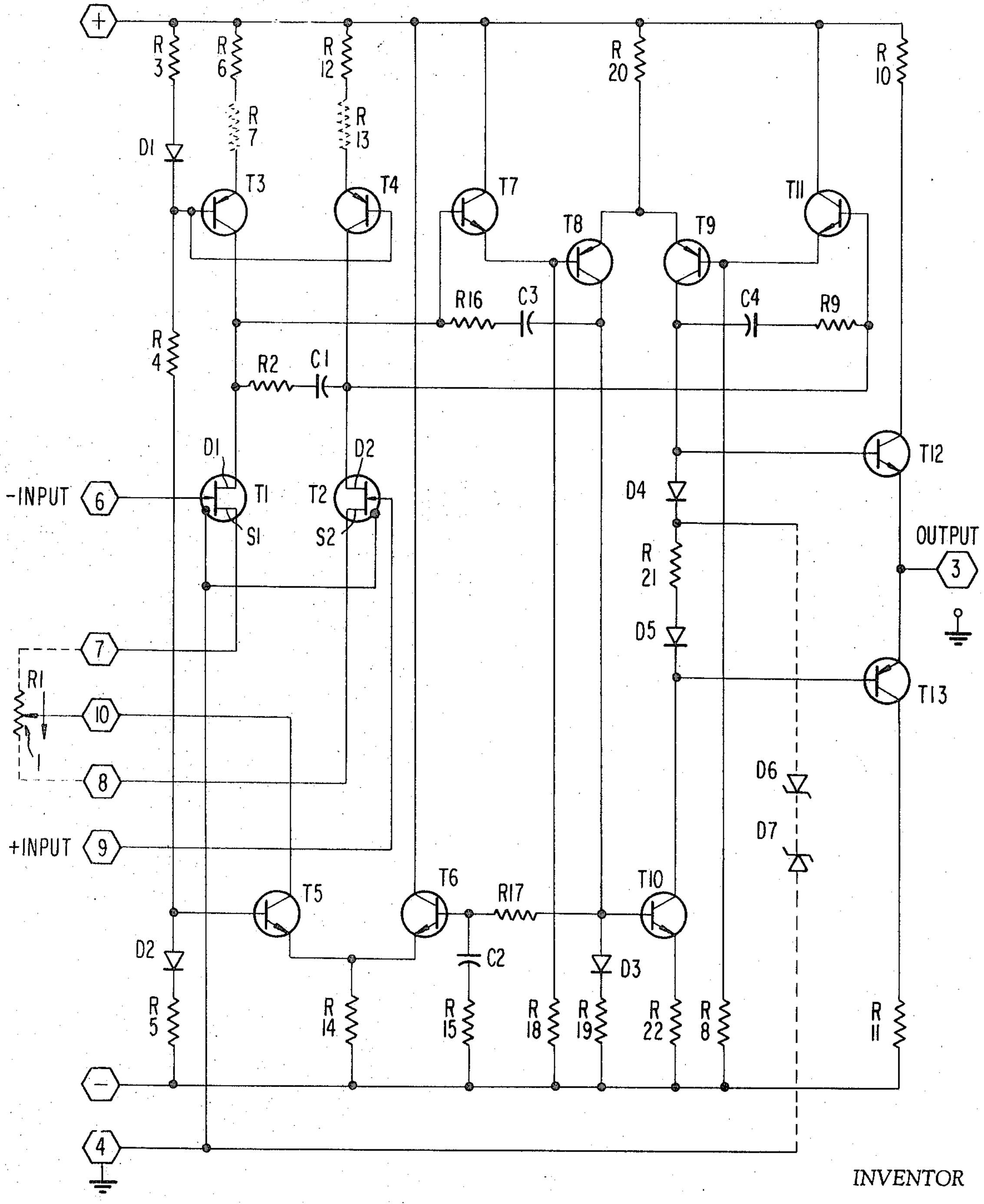
FIG. 1 is an electrical schematic diagram of the operational amplifier according to the invention.

DETAILED DESCRIPTION OF THE INVENTION:

FIG. 1 shows the circuit of applicant's invention comprising an operational amplifier. FET transistors T1 and T2 are connected in differential amplifier fashion and form the input or first stage of the amplifier. The gate of transistor T1 is connected to the negative (−) input terminal 6 and the gate of transistor T2 is connected to the positive (+) input terminal 9 of the operational amplifier. Input signals applied to the negative (−) input are inverted by the amplifier, whereas input signals applied to the positive (+) input are not. Resistor R1 is connected between sources S1 and S2 of FET's T1 and T2, respectively. In combination with its associated tap, resistor R1 comprises potentiometer 1 to provide a zero (0) adjustment of the input voltage offset.

The second stage of the amplifier includes a pair of NPN transistors T7 and T11 connected as emitter followers between the first and third stages. Drains D1 and D2 of transistors T1 and T2 are respectively connected to the bases of transistors T7 and T11. The emitters of transistors T7 and T11 are connected to the negative supply terminal through resistors R18 and R8, respectively, and their collectors are connected to the positive supply terminal.

The third stage includes PNP transistors T8, T9, and NPN transistor T10. Transistors T8 and T9 are connected in differential amplifier configuration with their bases respectively connected directly to the emitters of NPN transistors T7 and T11, the latter being connected as emitter followers. Thus, transistors T7 and T8 form a first complementary emitter follower configuration, and transistors T11 and T9 form a second complementary emitter follower configuration. The emitters of transistors T8 and T9 are connected through resistor R20 to the positive supply terminal.

The complementary emitter follower configurations described in which the bases of transistors T8 and T9 are driven by emitter followers T7 and T11, respectively, causes voltage variations in the base-emitter junctions of emitter followers T7 and T11, due to the temperature coefficients thereof, to compensate for voltage variations in the base-emitter junctions of the differential pair of transistors T8 and T9, respectively, due to the temperature coefficients of the latter. The DC input voltages applied to the bases of emitter followers T7 and T11 are therefore not affected by temperature variations. Thus, changes in the base-emitter voltage of transistor T8 due to the temperature coefficient thereof, are cancelled by corresponding opposite changes in the base-emitter voltage of transistor T7 due to the temperature coefficient of the latter. Similar compensation is provided for transistors T11 and T9. The input voltages applied to the bases of emitter followers T7 and T11 (which corresponds to the voltages at the collectors of transistors T3 and T4, respectively) relative to ground, are therefore substantially stable and do not vary in response to changes in voltage between the bases and emitters of transistors T7 and T11 due to the temperature coefficients thereof. The described circuit thus prevents drift due to transistor temperature coefficients of the input voltages applied to emitter followers T7 and T11.

The collector of transistor T9 is connected through the series connection of diode D4, resistor R21 and diode D5 to the collector of NPN transistor T10, while the base of the latter transistor is connected directly to the collector of transistor T8. The junction between the collector of transistor T8 and the base of transistor T10 is connected to the negative supply terminal through the series connection of diode D3 and resistor R19, the former serving to provide compensation for the temperature coefficient of the base-emitter junction of transistor T10. The collector of transistor T9 is thus connected to the negative supply terminal through transistor T10. The emitter of transistor T10 is connected to the negative supply terminal through resistor R22, equal to resistor R-19. Transistor T10 thus functions as an inverting amplifier having unity current gain.

A high-efficiency output circuit whose quiescent current at no load is very low as compared to its full load capability is provided by a forth stage. This stage includes PNP transistor T13 and NPN transistor T12, having their emitters directly connected together and to terminal 3, the output. The bases of transistors T12 and T13 are respectively connected to the collectors of transistors T9 and T10. Resistors R10 and R11 are respectively connected between the collectors of transistors T12 and T13 and the positive and negative supply terminals to prevent damage to the transistors in the event of short-circuiting of the amplifier output.

If it is desired to limit the output between selected positive and negative amplitude values, Zener diodes D6 and D7 may be connected in series opposing polarities between the junction of the cathode of diode D4 and resistor R21, and ground. However, it is not essential to utilize this connection, and it is therefore shown by dotted lines. The series connection of diode D4, resistor R21, and diode D5 is connected between the junction of the collector and base of transistors T9 and T12, respectively, and the junction of the collector and base of transistors T10 and T13, respectively. Junction diodes D4 and D5 improve linearity and compensate for the base-emitter temperature coefficients of transistors T12 and T13. Resistor R21 is selected to precisely establish the zero (0) signal quiescent current.

In substituting FET transistors for bipolar transistors in the input stage, it is normal to operate at a drain current significantly higher than that of the collector current when bipolar transistors are used because the transconductance of an FET is proportional to the square of the drain current and is significantly less than the transconductance of a bipolar transistor operating at the same current. Further, the input gate current of an FET transistor does not increase when the drain current is increased. The increased current resulting from the use of FET transistors would normally result in a proportional decrease in the resistance of their drain load resistors, and the resistance of the drain load resistors might be so low that no benefit in gain increase would result from use of the emitter followers T7 and T11.

In order to benefit from the use of the described emitter follower configurations, a sharp increase in drain load resistance must be realized. This could be achieved, for example, through a large increase in the positive supply voltage, thereby increasing the voltage drop developed across the drain load resistors. However, this is not very practical. The circuit shown in FIG. 1 provides the desired increase in drain load resistance by substituting PNP transistors T3 and T4, which function as constant current loads, for the passive linear resistors normally comprising the drain load resistances.

The input impedance of an emitter follower is relatively high, and its output impedance is relatively low. Several additional advantages result from its use in the circuit shown in FIG. 1. For example, the collector impedance of transistor T9 is increased for a reduced impedance feeding its base, and the emitter follower significantly reduces the base source impedance of transistor T9. The resulting increased collector impedance of transistor T9 significantly raises the gain of the third stage. Further, the differential impedance to the emitter followers is very high. In the circuit shown in U.S. Pat. No. 3,077,566, the differential impedance to the second stage was approximately 10 k.ohm, but the use of the emitter follower configurations provides a differential impedance in the order of approximately 1 megohm.

The circuit of FIG. 1 shows PNP transistors T3 and T4 connected in the drain load circuits of FET's T1 and T2, respectively. The emitter of transistor T3 is connected to the positive supply terminal through resistor R6. Similarly, the emitter of transistor T4 is connected to the positive supply terminal through resistor R12. Either trim resistor R7 is connected in series with resistor R6 or trim resistor R13 is connected in series with resistor R12, to obtain a precise match of the temperature coefficients of FET's T1 and T2. The collectors of transistors T3 and T4 are respectively connected directly to the drains of FET's T1 and T2.

The inclusion of transistors T3 and T4 in the drain load circuits of FET's T1 and T2, respectively, would cause the gain of the first stage to be maximized to an extent such that even with the temperature compensation provided, the first stage would be unstable and therefore not usable without stabilization means. Therefore, in order to stabilize the DC operating voltages at the inputs to emitter followers T7 and T11 (which are connected to the drains of FET's T1 and T2, respectively), the common mode feedback connection described below is employed. The casings of FET transistors T1 and T2 are grounded to improve performance by controlling undesired capacitive coupling.

A voltage divider comprising the series connection of resistor R3, diode D1, resistor R4, diode D2, and resistor R5, is connected between the positive and negative power supply terminals. The voltage drop across resistor R5 functions as a voltage reference for the common mode feedback regulator circuit. It is apparent that the voltage drop across resistor R5 is a percentage of the total voltage between the positive and negative supply terminals, and depends upon the relative resistance values of resistors R3, R4, and R5. A constant current regulator may be substituted for resistor R4 if the power supply voltage is unregulated in order that a stable reference voltage may be developed across resistor R5.

As described above, transistor T10 comprises a unity current gain inverter. The value of resistor R19 is selected such that an inverted replica of the average common mode (wherein the + and − inputs are connected together) value of the base voltages of transistors T7 and T11, as measured between the bases thereof and the positive supply terminal, is developed thereacross. If the voltage drop across resistor R19 is compared to the reference value developed across resistor R5, and any deviation from the normal is amplified and fed back, the average (common mode) value of the voltages at the bases of transistors T7 and T11 can be stabilized without influencing the differential mode gain.

The comparison is accomplished by employing a common mode feedback regulator comprising transistors T5 and T6. The collector current of transistor T5 must automatically assume whatever current value necessary to establish the correct value of the average (common mode) voltage at the bases of transistors T7 and T11. This is accomplished by the following described circuit.

Transistors T5 and T6 comprise NPN transistors connected in differential amplifier fashion with their emitters connected to the negative supply terminal through resistor R14. The collector of transistor T5 is connected to the tap of potentiometer 1, and the collector of transistor T6 is directly connected to the positive supply terminal.

The series connection of diode D2 and resistor R5 between the base of transistor T5 and the negative supply terminal provides compensation for variations in the base-emitter junction voltage due to the temperature coefficient thereof. Therefore, the voltage drop across resistor R14 connected between the emitters of transistors T5 and T6, and the negative power supply, is not a function of temperature. Also, diode D3 which is connected in series with resistor R19 between the base of transistor T10 and the negative supply terminal, provides compensation for variations in the base-emitter voltage of transistors T6, as well as for variations in the base-emitter voltage in the base of transistor T10, that may be caused by their temperature coefficients.

The normal current flowing through transistor T5 is the sum of the currents flowing through FET transistors T1 and T2 which are essentially equal. Therefore the current flowing through transistor T5 is typically equal to twice the current flowing through transistor T1. Further, for purposes of balance, the current flowing through transistor T6 is typically equal to the current through transistor T5. FET transistors T1 and T2 have equal source and drain currents, and thus have little effect on the functioning of the common mode feedback regulator.

The common mode feedback regulator functions to keep the average voltages at the drain-collector junctions of FET transistor T1 and transistor T3, and FET transistor T2 and transistor T4, and therefore the bases of emitter follower transistors T7 and T11, respectively, at constant voltage values well within the linear operating range of the junctions.

For example, if there is an increase in voltage (relative to ground) at the bases of transistors T7 and T11, the voltage developed across resistor R19 will decrease. Correspondingly, the voltage applied between the base and emitter of transistor T6 and hence the current applied to resistor R14 by the latter will tend to decrease. This will drive the emitter of transistor T5 more negative (relative to the normal condition) and thereby cause the current flowing through transistor T5 to increase tending to maintain the voltage drop across resistor R14 constant.

The current flowing through FET transistors T1 and T2 will thus increase, causing the voltage developed at their drains to decrease, relative to ground. Since the drains of transistors T1 and T2 are respectively connected to the bases of emitter followers T7 and T11, the voltages at the bases of transistors T8 and T9 will also decrease relative to ground, causing their emitter currents to increase. One-half of the increase in the sum of the emitter currents of transistors T8 and T9 flowing through resistor R20 will be applied to resistor R19, and the voltage developed across resistor R19 will correspondingly increase thereby compensating for the previous decrease in voltage. Compensation in the opposite manner is provided if the voltage across resistor R19 increases (relative to ground) in response to a change in the base voltages of transistors T7 or T11.

The reference voltage developed across resistor R5 and applied to the base-emitter of transistor T5 is thereby compared to the voltage between the base and emitter of transistor T6 (as determined by the voltage developed across resistor R19) and variations from the average value of the drain voltages of FET transistors T1 and T2 may thereby be compensated for in the above-described manner.

Resistors R19 and R20 are selected such that the voltages developed thereacross are equal to the voltage between the drains of transistors T1 and T2 and the positive supply terminal. Since the current through resistor R20 is twice the current through resistor R19 (because it is divided between transistors T8 and T9), the resistance of resistor R19 is selected arbitrarily to be twice the resistance of resistor R20. The average (common mode) value of the drain voltages of transistors T1 and T2 is steady due to the described common mode feedback connection, and the input stage is thus stable in operation.

In closing the common mode feedback connection loop, unstable operation resulting from undesirable oscillations might result, unless further means are provided to insure stability. To prevent this, resistor R17 is connected between the bases of transistors T6 and T10, and the series connection of capacitor C2 and resistor R15 is connected between the junction of the base of transistor T6 and resistor R17, and the negative power supply. This serves to control the high frequency phase shift of the common mode feedback amplifier circuit to prevent undesired oscillations and thereby provide stable operation.

The circuit shown in FIG. 1 produces stable common mode feedback, while permitting the successful use of the high gain draincollector connections provided by FET transistor T1 and transistor T3, and FET transistor T2 and transistor T4. Additionally, the amplifier provides very high input impedance.

When a plurality of amplifier stages are cascaded together and used with negative feedback, as in an operational amplifier, the additive effects of their phase lags will interfere with their use down to a low closed loop gain level, unless special provision is made to widely separate their "turnover frequencies" (the frequency at which the gain versus frequency characteristic of each stage changes from an essentially flat curve to a 6db per octave decreasing slope). The amplifier of the present invention is especially designed for wide separation of turnover frequencies, thereby enabling it to be operated down to unity gain without oscillation or objectionable transient response, but yet with a wider bandwidth and higher full output frequency compared to prior art operational amplifiers.

Thus the series connection of resistor R16 and capacitor C3 is connected between the base of transistor T7 and the collector of transistor T8. A similar series connection of resistor R9 and capacitor C4 is connected between the base of transistor T11 and the collector of transistor T9. Resistors R16 and R9, and capacitors C3 and C4, are equal in value. The series connection of resistor R2 and capacitor C1 provides, in conjunction with the above two described resistive-capacitive connections, an improved differential mode stabilization network. The values of resistor R2 and capacitor C1 are selected to control the phase frequency response of the amplifier to obtain wider overall bandwidth. Without this network, the amplifier would become unstable at high frequencies if operated down to unity gain because the turnover frequencies of the various stages would be too close together. By providing the resistive-capacitive networks described, the turnover frequencies of the various stages may be separated to an extent wherein differential mode stabilization is achieved. It is possible to achieve stability to unity gain with R2 and C1 omitted. This produces a different optimum value of R16 and C3 and R9 and C4 and a sacrifice in unity gain bandwidth.

The turnover frequency is, of course, that frequency at which the magnitude of the equivalent parallel source and load resistance equals the magnitude of the reactance of the distributed capacitance, or in the case of the addition of a physical capacitance, the impedance of the effective combination of the physical and distributive capacitance.

For instance, if three identical stages are direct coupled, their turnover frequencies will be identical and, when they are used with negative feedback, the additive phase lags provided by each stage will likely result in oscillation of the amplifier circuit. The amplifier stages of FIG. 1 are designed so that their turnover frequencies are quite different and widely separated, with the result that the total phase change does not result in oscillation, and also does not cause an intolerable transient response down to unity gain, as might be obtained if a total phase lag of over 140° would result. Controlling phase response in the amplifier to produce the desirable total phase lag range at a higher frequency, by employing the described differential mode stabilization network, causes wider bandwidth and higher full output frequency to be obtained.

The circuit described in relation to FIG. 1 is particularly advantageous because the potential drift resulting from the temperature coefficients of components following the input stage is much less than that in prior art operational amplifiers. This result is achieved, in part, because the voltage gain of the first stage typically approaches 500, and the first stage is stable in operation through use of the described common mode feedback regulator connection. The gain provided by the succeeding stages may therefore be relatively lower, and drift in the following stages therefore is not an overly critical factor.

Additionally, any effect of base-emitter voltage mismatch between transistors T7 and T11, or transistors T8 and T9, is reduced in degree because the source feeding transistors T7 and T11 is a current source and, as such, is less influenced by instability in base-emitter voltages. Still further, with a DC voltage drop of 2 volts across resistors R7 and R13, and with the base-emitter junction voltages of transistors T3 and T4 equal to approximately 0.5 volts, for example, the influence of base-emitter voltage mismatch between transistors T3 and T4 is reduced by a factor of approximately five because the effect thereof is spread over the total voltage drop of the circuit between the bases of transistors T3 and T4 and the positive supply terminal.

Transistors T3 and T4 comprise identical constant current loads for transistors T1 and T2, respectively, and share a common base connection to the junction of the cathode of diode D1 and resistor R3. The series connection of diode D1 and resistor R3 between the base connection and the positive supply terminal provides a temperature compensation voltage drop that compensates for variations in the base-emitter voltages of transistors T3 and T4 due to the temperature coefficients thereof. The same current source may supply the reference voltage at the bases of transistors T3 and T4 as supplies the reference voltage for transistors T5 and T6. Thus as discussed above, if the power supply is unregulated, a constant current source may be connected in place of resistor R4.

The resistors connected between the emitters of transistors T3 and T4 and the positive supply terminal should be matched in both absolute resistance value and temperature coefficient. Further, to optimize stable performance, the voltage between the base and emitters of transistors T3 and T4 should be matched. Then, with the bases of transistors T3 and T4 fed from the low impedance source described above, their collectors constitute current sources of high impedance value and excellent stability.

The temperature coefficient of the collector current in a bipolar coefficient of or drain current in an FET, is a function of the absolute value of the current. It is thus possible to precisely match the temperature coefficient of matched transistor devices by altering the relative currents in the drains (where FET's are used) or collectors (where bipolar transistors are used) of the matched differential device comprising transistors T1 and T2. Precise matching of the temperature coefficients of transistors T1 and T2 is achieved by selectively connecting trim resistors in series with resistors R7 and R13. Only one of trim resistors R6 and R12 is connected in the circuit, depending upon the mismatch between the transistors. The other resistor remains zero ohms. Since the temperature coefficientof the complete amplifier is almost entirely dependent upon transistors T1 and T2, it is desirable to select trim resistors R6 and R7 to trim the temperature coefficient of the entire amplifier, rather than of the input stage alone.

The resulting connection between transistors T1 and T3, and transistors T2 and T4, respectively, increases the input impedance of the first differential stage comprising transistors T1 and T2 by approximately two orders of magnitude. Further, the use of emitter followers T7 and T11 in the second stage, between the input stage comprising transistors T1 and T2 and the third differential stage comprising transistors T8 and T9, increases the effective input impedance of the third stage by approximately two orders of magnitude.

The operational amplifier shown in FIG. 1 functions in the differential mode of operation, if the + and − inputs are directly connected to the gates of FET transistors T1 and T2. Common mode operation results when the + and − inputs are connected, and the input is applied between the common connection and ground. Transistors T1 and T2 are shown as a matched pair of FET's. However, a matched pair of bipolar transistors may be substituted therefor. If transistors T1 and T2 comprise bipolar transistors, the respective collectors would be connected directly to the collectors of transistors T3 and T4, and their emitters would be connected to opposite ends of resistor R1. The bases of transistors T1 and T2 would then be connected to the + and − inputs, respectively. Substitution of bipolar transistors for the FET transistors shown in FIG. 1 would provide, in conjunction with the rest of the circuit, an amplifier having exceptionally high gain and low drift. However, a reduction in the collector currents of input transistors T1 and T2, relative to that when FET transistors are used, would normally result.

Figure 2:
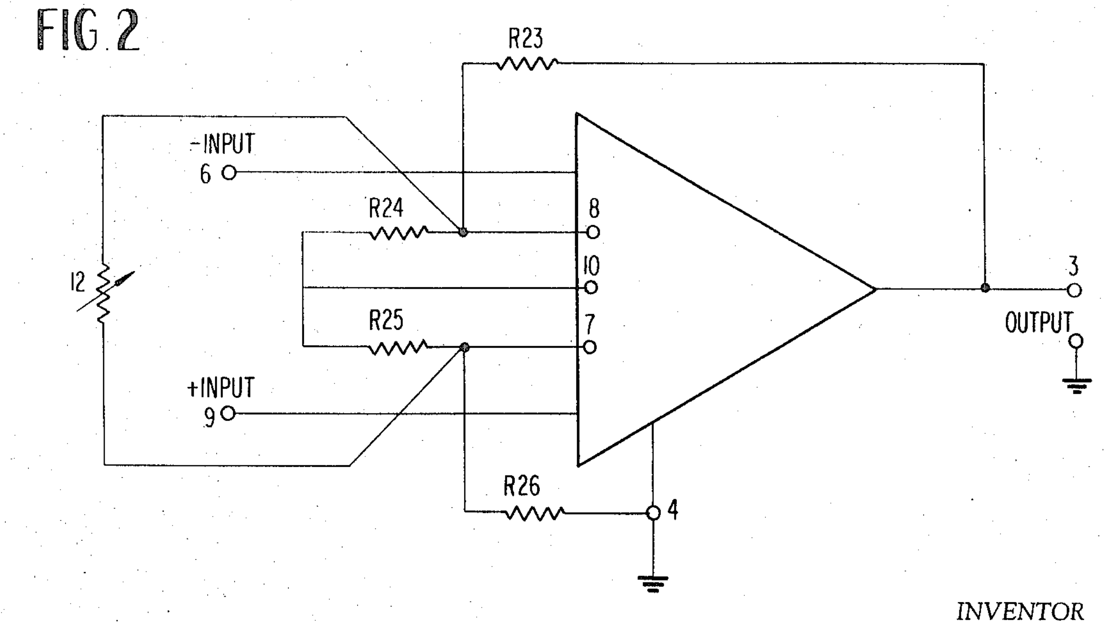
FIG. 2 is a block diagram showing how the operational amplifier of FIG. 1 may be adapted to comprise a true differential amplifier.

The operational amplifier as shown in FIG. 1 may be connected in the high gain, true differential amplifier circuit shown in FIG. 2. In this regard, a true differential amplifier provides a very high input impedance to both inputs (− and +) simultaneously, compared to conventional operational amplifiers. The inclusion of the common mode negative feedback regulator in the operational amplifier shown in FIG. 1, and connection of the zero control between the collector of transistor T5 and the sources S1 and S2 of transistors T1 and T2, enhance the use of the operational amplifier in the true differential amplifier circuit shown.

When the operational amplifier is used in a differential amplifier configuration, negative feedback to the FET sources S1 and S2 must be supplied. A simple form of feedback connection to convert the operational amplifier of FIG. 1 to a differential amplifier is shown in FIG. 2. This general type of connection, in association with an operational amplifier, is conventional.

There, resistor R23 is connected between output 3 of the operational amplifier shown in FIG. 1 and source S2 of transistor T2 (terminal 8). Resistor R24 is connected between source S2 of transistor T2 (terminal 8) and the collector of transistor T5 (terminal 10). Resistor R25 is connected between the collector of transistor T5 (terminal 10) and source S1 of transistor T1 (terminal 7). Resistor R26 is connected between source S1 of transistor T1 (terminal 7) and ground (terminal 4). Potentiometer 12 provides an adjustable gain control.

To obtain common mode rejection (equal to the open loop differential gain divided by the open loop common mode gain of the operational amplifier), R23/R24 should be equal to R26/R25. In this type of differential amplifier circuit, the amplifier gain is:

$$A = R23 + R24 + R25 + R26 / R24 + R25$$

Figure 3:
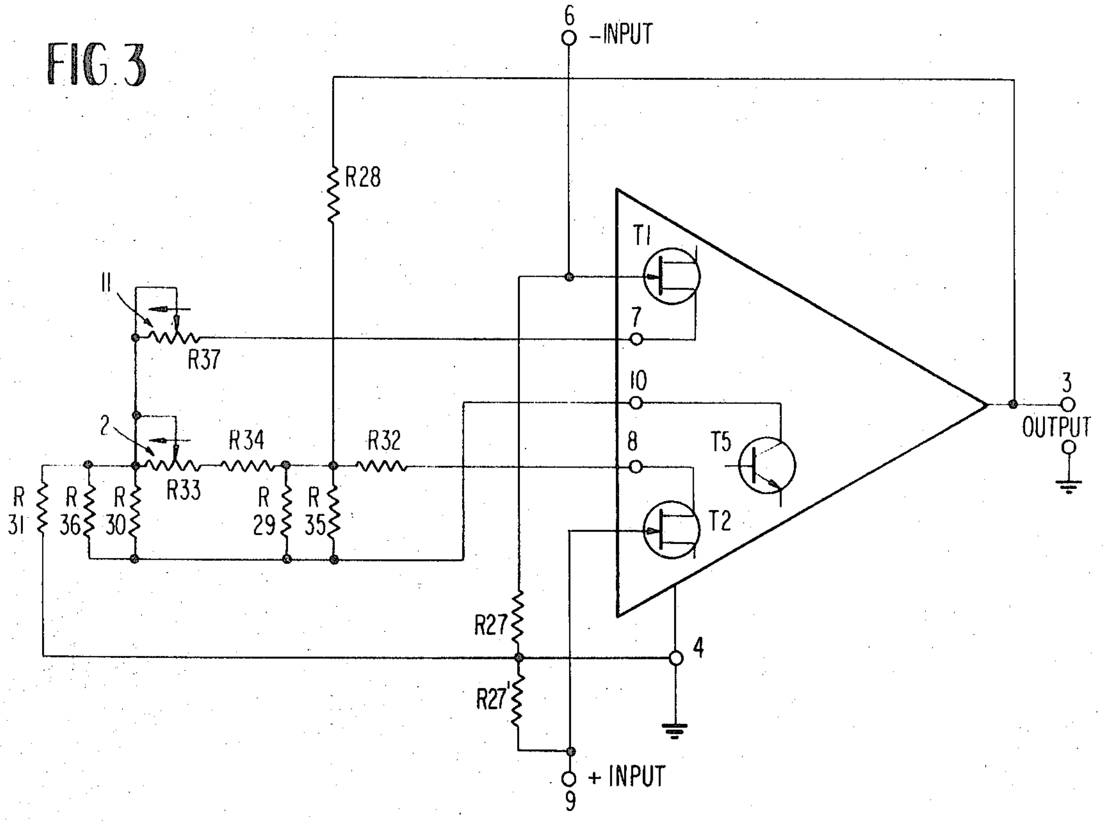
FIG. 3 is an electrical schematic diagram showing how the operational amplifier of FIG. 1 may be connected to comprise a practical true differential amplifier.

However, the simplified differential amplifier circuit shown in FIG. 2 must be modified for various reasons. A practical arrangement of the use of the operational amplifier shown in FIG. 1, in a differential amplifier configuration, is shown in FIG. 3.

Resistors R27 and R27′ are connected between the − and + input terminals and ground (terminal 4). These have resistance values of approximately 1 megohm, but may be omitted if a DC return path is provided. In their absence, the common-mode and differential-mode input resistances would typically exceed 1,000 megohms.

Resistor R28 is connected between the output terminal (3) of the operational amplifier shown in FIG. 1 and source S2 of transistor T2 (terminal 8) through resistor R32. Resistor R29 is connected between the collector of transistor T5 (terminal 10) and the junction of resistors R28 and R32. Resistor R30 is connected between the collector of transistor T5 (terminal 10) and one end of resistor R33. The series connection of resistors R33 and R34 shunts resistors R29 and R30. Further, either resistor R35 or resistor R36 is connected in the circuit in parallel with resistors R29 and R30, respectively. That is, only one of resistors R35 and R36 is connected in the circuit, as will be explained hereafter. It is seen that resistor R33 in combination with its associated tap forms potentiometer 2, the tap being connected to the common junction of resistors R30, R31, R33, R36, and R37. Resistor R31 is connected between this common junction and ground (terminal 4) and resistor R37 is connected between the common junction and source S1 of transistor T1 (terminal 7). In conjunction with its associated tap, it comprises potentiometer 11.

The above-described circuit components have the following functions. Potentiometer 11 and resistor R32 are added in series with sources S1 and S2 of transistors T1 and T2, respectively, and provide a zero adjustment means to remove any residual voltage offset. In this regard, potentiometer 1 of FIG. 1 is deleted, as shown in FIG. 3. In order to achieve the maximum common-mode rejection (equal to the open loop differential-mode gain divided by the open loop common-mode gain of the operational amplifier) the ratios of the resistance values of the resistors described in relation to FIG. 3 should be such that R28/R29 = R31/R30.

In the practical embodiment of the invention shown in FIG. 3, either resistor R30 is shunted by resistor R36 or resistor R29 is shunted by resistor R35 to precisely establish the above ratio. In this regard, resistors R28 through R31 correspond to resistors R23 through R26, respectively, of FIG. 2. If the ratios are precisely equal, and the input is zero, the voltage across the series connection resistor R33 and R34 will be equal to zero.

Adjustable gain is provided in the circuit shown in FIG. 2, by potentiometer 12. In this regard, resistors R33 and R34 may comprise a single resistor which, in combination with the variable tap associated therewith, forms a potentiometer. The greater the value of effective resistance between the ends of potentiometer 12, the less the gain of the differential amplifier.

Because resistors R28 and R31 comprise feedback resistors, the current therethrough must be limited. When the circuit shown in FIG. 3 is operating under conditions where there is a common mode input signal, transistor T5 still functions to maintain constant drain currents in FET transistors T1 and T2 (or if bipolar transistors are used, constant collector currents in transistors T1 and T2), and also causes current to be fed through resistor R31 to ground, and through resistor R28 to output 3 of the operational amplifier. If the resistances of resistors R28 and R31 are too low, transistor T5 will be overloaded and will not function to maintain constant drain currents (or if bipolar transistors are used, constant collector currents) in transistors T1 and T2. This, of course, could result in overloaded operation of the input stage of the operational amplifier.

Therefore, the resistance values of resistors R28 and R31 should be as low as practical without overloading the current delivering capability of the common-mode regulator. Additionally, if the resistance of resistor R28 is too large, the resistance of resistor R29 will correspondingly have to be increased (because of the required ratio) and the input impedance of the circuit connected to the operational amplifier will be excessively raised., thus deteriorating high frequency performance. Therefore, the resistance of resistor R28 and consequently of R31 (because of the ratio requirements) must be relatively low, but yet must not be selected so low as to overload the common mode feedback regulator.

The operational amplifier shown in FIG. 1 provides many advantages over prior art operational amplifiers. The use of FET transistors connected in the input stage, as shown by transistors T1 and T2, provides a high gain, which is typically of the order of $0.5 \times 10^6$ open loop gain. If bipolar transistors are substituted for FET transistors T1 and T2 in the input stage of the operational amplifier, the open loop gain can be increased by an order of magnitude and would typically approach $5 \times 10^6$.

Further, since the input stage provides an order of gain of approximately 500 when FET transistors are used (and approximately 5,000 where bipolar transistors are used in the input stage), the gain of the succeeding stages may necessarily be substantially lower compared to prior art devices, to obtain the same overall gain. For example, where FET transistors are used in the input stage of the operational amplifier, and with the first input stage providing a gain in the order of 500, the succeeding stages need only provide a gain of 1,000 in order to obtain an overall gain of $.5 \times 10^6$. Therefore, matching of components in succeeding stages is not overly critical, since the input stage provides high gain. Further, mismatch of components comprising the input stage is compensated by the common mode feedback regulator connection.

The operational amplifier according to the invention has a typical unity gain bandwidth of 10 meg.cs., and full output to at least 200 k.cs. Whereas the input impedance of the operational amplifier shown in U.S. Pat. No. 3,077,566 is typically 50,000 ohms, an input impedance exceeding 1,000 megohms, depending upon the particular FET's utilized in the input stage, is achieved.

Further, since the semiconductor junctions of the transistors are compensated by the use of the described tracking junctions comprising diodes connected between the bases and emitters thereof, drift due to the temperature coefficients of the transistors in minimized, and corresponding stability in operating values of the transistors is achieved. Another advantage of the operational amplifier shown in FIG. 1 results from the ease with which it may be connected to comprise a true differential amplifier as described with relation to FIG. 3.

The circuits shown merely represent preferred embodiments of the invention. It will be appreciated that minor modifications or additions to circuits shown in the figures could readily be made without departing from the scope of the invention. For instance, it will be appreciated that polarities of the various transistors could be changed with corresponding changes in other circuits and polarities of like voltages. Many other minor modifications could also be made. The invention therefore is to be measured by the scope of the appended claims, rather than limited to the preferred embodiments described herein.

In the claims:

1. An operational amplifier comprising:

a first amplifier stage having first (T1) and second (T2) transistors arranged in differential amplifier manner, each of the first and second transistors having a first electrode operative to provide a current flow, a second electrode operative to control the current flow, and a third electrode operative to accept the current flow connected as the output electrode, means to apply opposite polarity inputs to the respective second electrodes of the first and second transistors, load means including third and fourth transistors (T3,T4), each having emitter, collector and base electrodes, the third and collector electrodes of the first and third transistors, respectively, being connected in common as a first common connection, and the third and collector electrodes of the second and fourth transistors, respectively, being connected in common as a second common connection, the base electrodes of the third and fourth transistors being connected together, the third and fourth transistors providing first and second constant current loads for the first and second transistors, respectively, at least one additional amplifier stage (T7, T8, T9, T10, T11) having first and second inputs respectively connected to the first and second common connections of the first stage and its output connected as the amplifier output, positive (+) and negative (−) supply terminals for connection to a suitable source of DC voltage, and means connecting the electrodes of the transistors to the supply terminals to operatively bias the transistors, a source of reference potential, and common mode feedback means (T5, T6, R15, R17, R19, C2) connected between said at least one additional stage and the first amplifier stage including means connected to the source of reference potential and responsive to differences between the actual voltages present at the outputs of the first and second transistors and the reference potential to correct the actual voltages present at the outputs of the first and second transistors and maintain the preset common mode output voltages from the first and second transistors at a constant value.

2. The operational amplifier recited in claim 1 wherein said at least one additional stage comprises:

a second stage including fifth (T7) and sixth (T11) transistors arranged as emitter followers respectively connected to the outputs of the first (T1) and second (T2) transistors, a third stage including seventh (T8) and eighth (T9) transistors arranged in differential amplifier fashion, the bases of the seventh and eighth transistors respectively being connected to the emitters of the fifth and sixth transistors, and being of opposite polarity with respect to the latter, the outputs of the seventh (T8) and eighth (T9) transistors being coupled to the operational amplifier output.

3. The operational amplifier recited in claim 2 wherein said third stage further includes a ninth (T10) transistor of opposite polarity with respect to the seventh (T8) and eighth (T9) transistors, the collector of said seventh (T8) transistor being directly connected to the base of the ninth (T10) transistor and the collectors of the eighth (T9) and ninth (T10) transistors being connected together, means (R19) connected across the base and emitter of the ninth (T10) transistor to develop a voltage corresponding to the actual voltages present at the outputs of the first and second transistors, the common mode feedback means being connected between said last cited means and the first (T1) and second (T2) transistors.

4. The operational amplifier recited in claim 1 wherein the first (T1) and second (T2) transistors each comprise field effect transistors with the first electrode being the source and the third electrode being the drain.

5. The operational amplifier recited in claim 4 wherein the sources (S1, S2) of the first (T1) and second (T2) transistors are connected to the common mode feedback means and the drains of the first (T1) and second (T2) transistors are respectively connected to the collectors of the third (T3) and fourth (T4) transistors, the emitters of the latter being connected to the positive supply terminal.

6. The operational amplifier recited in claim 4 wherein the common mode feedback means are connected between the output of said at least one additional stage and the sources (S1, S2) of the first (T1) and second (T2) transistors.

7. The operational amplifier recited in claim 4 further comprising:

variable resistance means (1) interposed between the common mode feedback means and the sources (S1, S2) of the first (T1) and second (T2) transistors to provide zero (0) voltage adjustment for the latter.

8. The operational amplifier recited in claim 1 further comprising:

matching means selectively connected between the third (T3) and fourth (T4) transistors and the positive supply terminal to provide precise matching of the operating characteristics of the transistors to prevent amplifier drift.

9. The operational amplifier recited in claim 1 further comprising:

compensation means (D1–D5) connected to selected transistors to compensate for the temperature coefficients thereof.

10. The operational amplifier recited in claim 1 further comprising:

stabilizing means connected to selected amplifier stages (R16, C3; R9, C4; R2, C1) to separate the turnover frequencies of the amplifier stages and thereby reduce possibilities of oscillation due to feedback with low closed loop gain.

11. The operational amplifier recited in claim 1 further comprising:

feedback connection means coupled between the output and input connections of the operational amplifier so that it functions as a differential amplifier including first (28) resistance means connected between the output of the operational amplifier (3) and the first electrode (8) of the second transistor (T2), second (30) and third (20) resistance means respectively connected between the first electrodes (7,8) of the first (T1) and second transistors (T2) and the common mode feedback means (T5), fourth resistance means (31) connected between the third electrode (8) of the second transistor (T2) and ground (4), adjustable gain control means (2) shunting the second (30) and third (29) resistance means to control the gain of the differential amplifier by varying the effective values of the second and third resistances, variable resistance (R37 and R32) means connected to the electrodes of the first (T1) and second (T2) transistors to provide zero (0) voltage adjustment for the latter.

12. The operational amplifier recited in claim 11 wherein the first (T1) and second (T2) transistors comprise field effect transistors with the first electrode being the source and the third electrode being the drain.

* * * * *